United States Patent [19]

Filliman

[11] Patent Number: 4,482,921

[45] Date of Patent: Nov. 13, 1984

[54] LEVEL SHIFTER FOR AN AUTOMATIC KINESCOPE BIAS SAMPLING SYSTEM

[75] Inventor: Paul Filliman, Indianapolis, Ind.

[73] Assignee: RCA Corporation, New York, N.Y.

[21] Appl. No.: 437,830

[22] Filed: Oct. 29, 1982

[51] Int. Cl.³ .................. H04N 5/68; H04N 9/535
[52] U.S. Cl. ..................... 358/243; 358/27; 358/74
[58] Field of Search ............. 358/242, 243, 27, 29, 358/34, 64, 65, 74, 171, 172; 307/352, 353; 328/150, 151, 168, 169, 171, 172, 175

[56] References Cited

U.S. PATENT DOCUMENTS 4,331,981  5/1982  Parker ............................. 358/243
4,387,405  6/1983  Hinn ............................... 358/243
4,414,577  11/1983  Tallant ........................... 358/242

Primary Examiner—Tommy P. Chin
Attorney, Agent, or Firm—Eugene M. Whitacre; Paul J. Rasmussen; Ronald H. Kurdyla

[57] ABSTRACT

A system for automatically controlling the bias of a kinescope in a television receiver comprises a clamping reference network including an input coupling capacitor, and a sampling amplifier. Signals to be sampled are coupled from the clamping capacitor to the amplifier by a level shifting network for providing signals compatible with the input requirements of the amplifier. The level shifting network is non-conductive at all times except during the kinescope bias control intervals, thereby effectively decoupling the clamping capacitor to prevent its being discharged.

13 Claims, 3 Drawing Figures

LEVEL SHIFTER FOR AN AUTOMATIC KINESCOPE BIAS SAMPLING SYSTEM

This invention concerns a level shifting circuit associated with a signal clamping and sampling function in a system for automatically controlling the bias of a kinescope in a television receiver.

Color television receivers sometimes employ an automatic kinescope bias (AKB) control system for automatically establishing proper black image representative current levels for each electron gun of a color kinescope associated with the receiver. As a result of this operation, pictures reproduced by the kinescope are prevented from being adversely affected by variations of kinescope operating parameters (e.g., due to aging and temperature effects).

An AKB system typically operates during image blanking intervals, at which time each electron gun of the kinescope conducts a small black image representative blanking current in response to a reference voltage representative of black video signal information. This current is processed by the AKB system to generate a signal which is representative of the currents conducted during the blanking interval, and which is used to maintain a desired black current level.

In one type of AKB system control circuits respond to a periodically derived pulse signal with a magnitude representative of the cathode black current level. The derived signal exhibits a level other than zero when the black current level is correct, and different levels (e.g., more or less positive) when the black current level is too high or too low. The derived signal is processed by control circuits including clamping and sampling networks for developing a kinescope bias correction signal which increases or decreases in magnitude and is coupled to the kinescope for maintaining a correct black current level. The clamping network includes a clamping capacitor for establishing a reference condition for the signal information to be sampled. The reference condition is established by applying a reference voltage to the clamping capacitor which is coupled to the sampling network during the clamping interval. An AKB system of this type is described in U.S. Pat. No. 4,331,981.

In the AKB system disclosed herein, the black current representative signal is derived at a sensing point which, during video signal picture intervals when the AKB system is inactive, exhibits voltage variations related to amplitude variations of the video signal. The magnitude of the reference voltage developed on the clamping capacitor at the input of the AKB signal processing system is chosen such that the normally expected magnitude of the video signal during the active picture interval, and particularly the magnitude of white-going video signal peaking components, do not impair the intended operation of the input circuits of the AKB signal processor.

It is recognized herein that in a system of the type described, the level of the input signals applied to the sampling amplifier of the AKB system should be compatible with the input requirements of the sampling amplifier, consistent with an objective of providing a sampling amplifier with good dynamic range. It is furthermore recognized herein that, in an AKB system employing an input charge storage device such as a clamping capacitor prior to the sampling amplifier, the clamping capacitor should not be permitted to discharge significantly during the picture intervals. The latter requirement is particularly important in an AKB system which samples small signal amplitude variations (e.g., on the order of a few millivolts), since in such a system it is important to assure that the clamping network establishes a reliably accurate reference for the small signal amplitude variations being sampled within a small time interval. These objectives are satisfied by a circuit arrangement according to the present invention.

In accordance within the present invention there is disclosed herein an AKB signal processing system comprising a clamping reference network including a capacitor, and a sampling amplifier. Signals to be sampled are coupled from the clamping capacitor to the sampling amplifier by means consisting of a level shifting network for providing signals to be sampled which are compatible with the input requirements of the sampling amplifier. In accordance with a feature of the invention, the level shifting network is rendered non-conductive at times other than the AKB operating intervals, thereby effectively decoupling the clamping capacitor to prevent its being discharged significantly.

Figure 1:
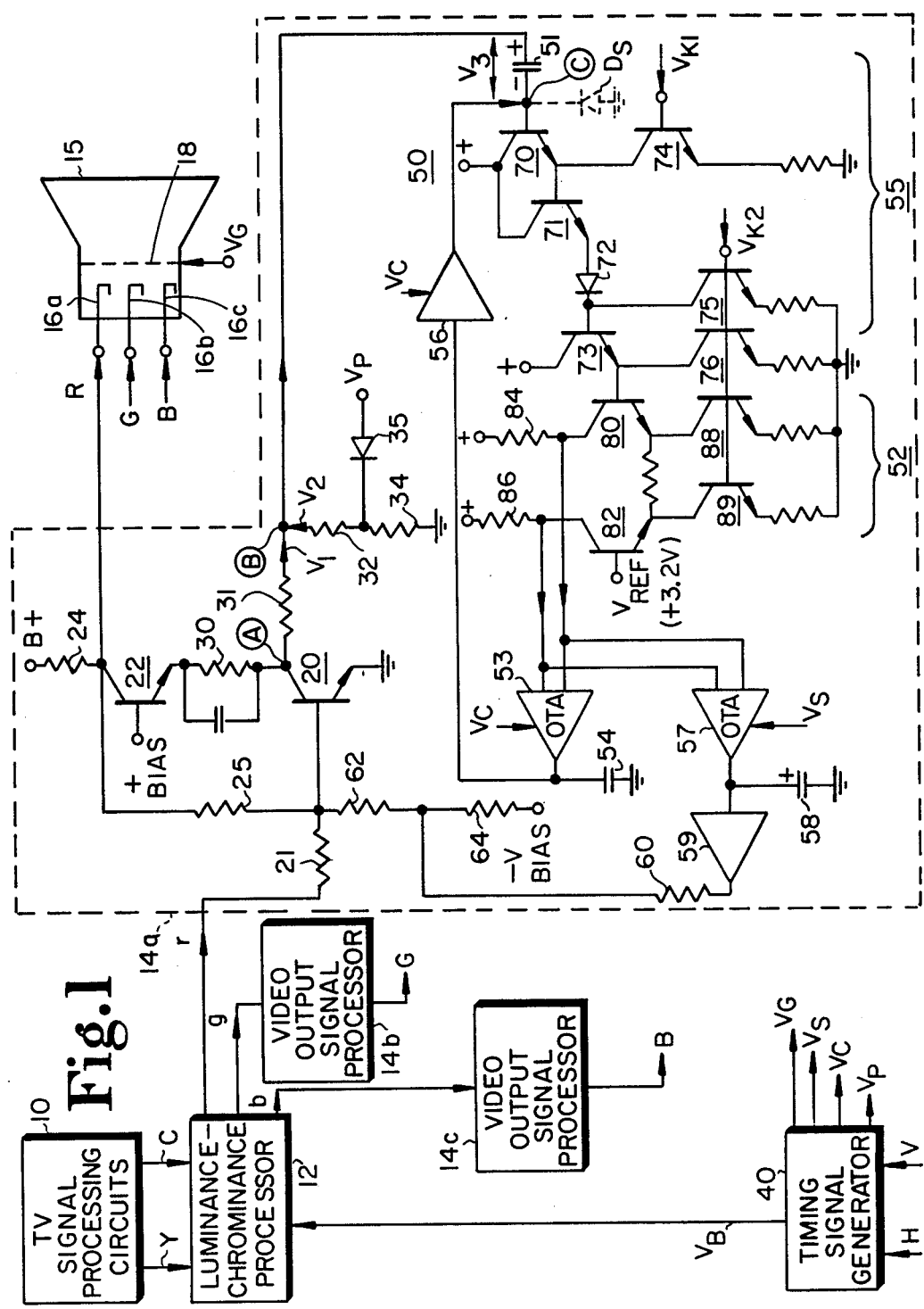
FIG. 1 shows a portion of a color television receiver with an automatic kinescope bias control system including a signal sampling network and an associated level shifting circuit according to the principles of the present invention.

In FIG. 1, television signal processing circuits 10 provide separated luminance (Y) and chrominance (C) components of a composite color television signal to a luminance-chrominance signal processing network 12. Processor 12 includes luminance and chrominance gain control circuits, DC level setting circuits (e.g., comprising keyed black level clamping circuits), color demodulators for developing r-y, g-y and b-y color difference signals, and matrix amplifiers for combining the latter signals with processed luminance signals to provide low level color image representative signals r, g and b. These signals are amplified and otherwise processed by circuits within video output signal processing networks 14a, 14b and 14c, respectively, which supply high level amplified color image signals R, G and B to respective cathode intensity control electrodes 16a, 16b and 16c of a color kinescope 15. Networks 14a, 14b and 14c also perform functions related to the automatic kinescope bias (AKB) control function, as will be discussed. Kinescope 15 is of the self-converging in-line gun type with a commonly energized control grid 18 associated with each of the electron guns comprising cathode electrodes 16a, 16b and 16c.

Since output signal processors 14a, 14b and 14c are similar in this embodiment, the following discussion of the operation of processor 14a also applies to processors 14b and 14c.

Processor 14a includes a kinescope driver stage comprising an input transistor 20 configured as a common emitter amplifier which receives video signal R from processor 12 via an input resistor 21, and an output high voltage transistor 22 configured as a common base amplifier which together with transistor 20 forms a cascode video driver amplifier. High level video signal R, suitable for driving kinescope cathode 16a, is developed across a load resistor 24 in the collector output circuit of transistor 22. Direct current negative feedback for driver 20, 22 is provided by means of a resistor 25. The signal gain of cascode amplifier 20, 22 is primarily determined by the ratio of the value of feedback resistor 25 to the value of input resistor 21.

A sensing resistor 30 DC coupled in series with and between the collector-emitter paths of transistors 20, 22 serves to develop a voltage, at a relatively low voltage sensing node A, representing the level of kinescope cathode black current conducted during kinescope blanking intervals. Resistor 30 functions in conjunction with the AKB system of the receiver, which will now be described.

A timing signal generator 40 containing combinational and sequential logic control circuits as well as level shifting circuits responds to periodic horizontal synchronizing rate signals (H) and to periodic vertical synchronizing rate signals (V), both derived from deflection circuits of the receiver for generating timing signals $V_B$, $V_S$, $V_C$, $V_P$ and $V_G$ which control the operation of the AKB function during periodic AKB intervals. Each AKB interval begins shortly after the end of the vertical retrace interval within the vertical blanking interval, and encompasses several horizontal line intervals also within the vertical blanking interval and during which video signal image information is absent. These timing signals are illustrated by the waveforms in FIG. 2.

Figure 2:
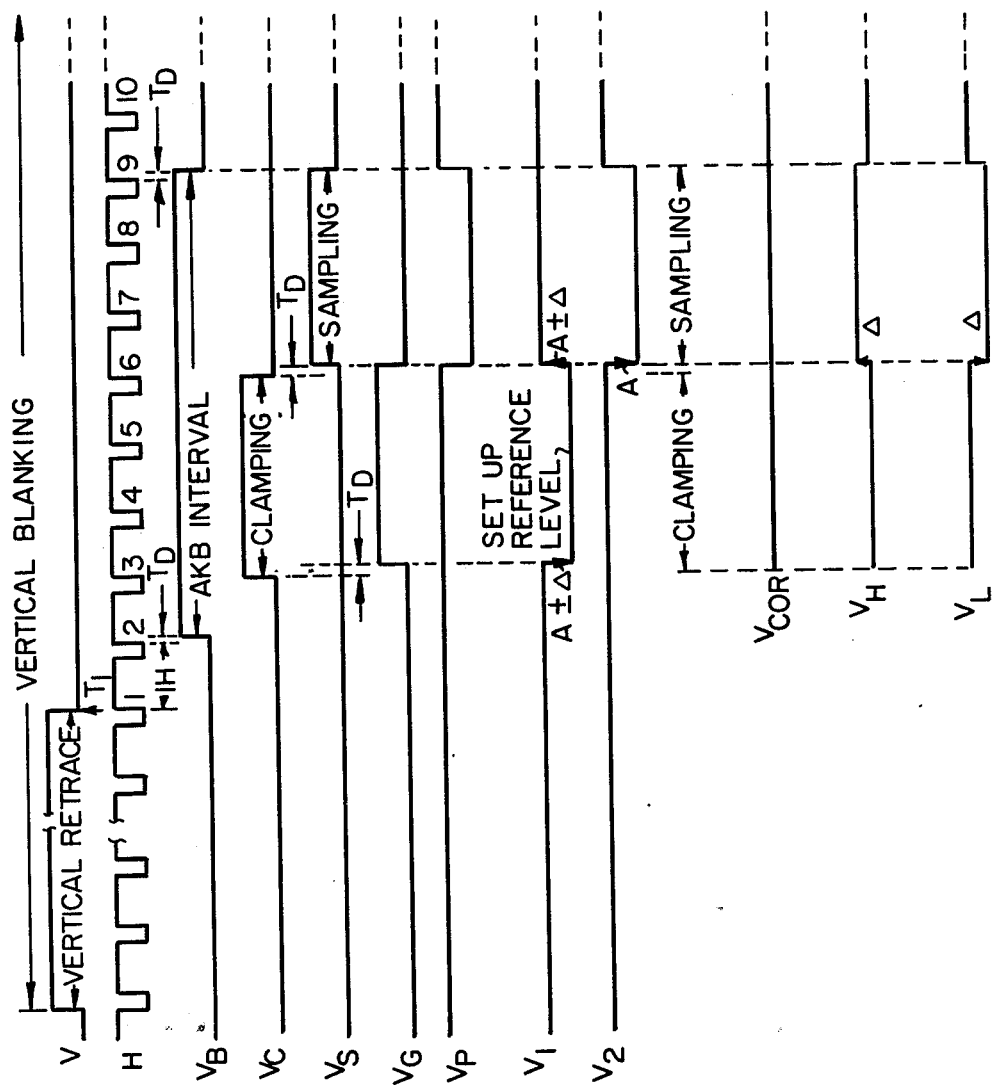
FIG. 2 illustrates signal waveforms associated with the operation of the system in FIG. 1.

Referring to FIG. 2 for the moment, timing signal $V_B$, used as a video blanking signal, comprises a positive pulse generated soon after the vertical retrace interval ends at time $T_1$, as indicated by reference to signal waveform V. Blanking signal $V_B$ exists for the duration of the AKB interval and is applied to a blanking control input terminal of luminance-chrominance processor 12 for causing the r, g and b outputs of processor 12 to exhibit a black image representative DC reference level at the signal outputs of processor 12. Timing signal $V_G$, used as a positive drive pulse, encompasses three horizontal line intervals within the vertical blanking interval. Timing signal $V_C$ is used to control the operation of a clamping circuit associated with the signal sampling function of the AKB system. Timing signal $V_S$, used as a sampling control signal, occurs after signal $V_C$ and serves to time the operation of a sample and hold circuit which develops a DC bias control signal for controlling the kinescope cathode black current level. Signal $V_S$ encompasses a sampling interval the beginning of which is slightly delayed relative to the end of the clamping interval encompassed by signal $V_C$, and the end of which substantially coincides with the end of the AKB interval. A negative-going auxiliary pulse $V_P$ coincides with the sampling interval. Signal timing delays $T_D$ indicated in FIG. 2 are on the order of 200 nanoseconds.

Referring again to FIG. 1, during the AKB interval positive pulse $V_G$ (e.g., on the order of +10 volts) biases grid 18 of the kinescope for causing the electron gun comprising cathode 16a and grid 18 to increase conduction. At times other than the AKB intervals, signal $V_G$ provides the normal, less positive, bias for grid 18. In response to positive grid pulse $V_G$, a similarly phased, positive current pulse appears at cathode 16a during the grid pulse interval. The amplitude of the cathode output current pulse so developed is proportional to the level of cathode black current conduction (typically a few microamperes).

The induced positive cathode output pulse appears at the collector of transistor 22, and is coupled to the base input of transistor 20 via resistor 25, causing the current conduction of transistor 20 to increase proportionally while the cathode pulse is present. The increased current conducted by transistor 20 causes a voltage to be developed across sensing resistor 30. This voltage is in the form of a negative-going voltage change which appears at sensing node A and which is proportional in magnitude to the magnitude of the black current representative cathode output pulse. The magnitude of the voltage perturbation at node A is determined by the product of the value of resistor 30 times the magnitude of the perturbation current flowing through resistor 30. The voltage change at node A is coupled via a small resistor 31 to a node B at which a voltage change $V_1$, essentially corresponding to the voltage change at node A, is developed. Node B is coupled to a bias control voltage processing network 50.

Network 50 performs signal clamping and sampling functions. The clamping function is performed during a clamping interval within each AKB interval by means of a feedback clamping network comprising an input AC coupling capacitor 51, a level shifting circuit 55, an amplifier 52, a keyed operational transconductance amplifier (OTA) 53, a filter capacitor 54, and a keyed buffer amplifier 56 (e.g., comprising an emitter follower stage) which acts as an electronic switch. The sampling function is performed during a sampling interval, following the clamping interval during each AKB interval, by means of a network comprising level shifting circuit 55, amplifier 52, a keyed operational transconductance amplifier (OTA) 57, and an average responding charge storage capacitor 58. Level shifting circuit 55 and amplifier 52 are operative during both the clamping and sampling intervals.

A kinescope bias correction voltage is developed across capacitor 58 and is coupled via a low output impedance buffer amplifier 59 and a resistor network 60, 62, 64 to the kinescope driver via a bias control input at the base of transistor 20. The correction voltage developed across capacitor 58 serves to automatically maintain a desired correct level of kinescope black current conduction. The bias correction voltage developed across storage capacitor 58 is a function of both voltage change $V_1$ developed at node B during the clamping interval, and a voltage change $V_2$ developed at node B during the subsequent sampling interval, as will be discussed in greater detail subsequently in connection with the waveforms shown in FIG. 2.

During the clamping set-up reference interval, both OTA 53 and switch 56 are rendered conductive in response to clamping control signal $V_C$. At this time OTA 57 is non-conductive so that the charge on storage capacitor 58 remains unaffected during the clamping interval. As a consequence of the feedback action during the clamping interval, the negative terminal (−) of capacitor 51 is referenced to (i.e., clamped to) a reference voltage $V_R$ which is a function of a fixed reference voltage $V_{REF}$ applied to an input of amplifier 52. At this time the voltage $V_3$ across input capacitor 51 is a function of the level of voltage change $V_1$ developed at node B, and reference voltage $V_R$ provided via the feedback action.

During the following sampling interval when voltage change $V_2$ is developed at node B, OTA 53 and switch 56 are rendered non-conductive, and OTA 57 is rendered conductive in response to sampling control signal $V_S$. The magnitude of voltage change $V_2$ is indicative of the magnitude of the kinescope black current level, and is sampled by means of amplifier 52 and OTA 57 to develop a corresponding voltage across storage capacitor 58.

The functional aspects of level shifting circuit 55 will now be discussed.

In this regard it is first noted that nodes A and B exhibit a nominal DC voltage ($V_{DC}$) of approximately +8.8 volts for black signal level conditions during the AKB interval except when voltage change $V_2$ is generated during AKB sampling intervals (as will be discussed subsequently). This voltage level is also exhibited during active picture intervals when the video signal information processed by driver amplifier 20, 22 corresponds to a black picture display. The voltage at nodes A and B becomes less positive as the conduction of driver amplifier 20, 22 increases in response to video signals representative of increasingly white picture information. A heavily peaked video signal will exhibit white-going transient peaking components which produce corresponding negative-going transient peaking voltages of significant amplitude at nodes A and B during picture intervals. Such negative-going transients are coupled to AKB input clamping capacitor 51 during picture intervals, and can have a disruptive effect on the reference voltage at the negative (−) terminal of clamping capacitor 51 unless compensation is provided, as follows The input of the AKB signal processor is designated by a node C to which the negative terminal of clamp capacitor 51 is coupled. The input voltage at node C is substantially equal to +6.0 volt reference voltage $V_R$, except during the sampling interval when the input voltage changes slightly (by a few millivolts) during the sampling interval if kinescope bias is incorrect.

The reference voltage on capacitor 51 should not be significantly disturbed from one AKB interval to another. However, this reference voltage is subject to being undesirably changed drastically when a large negative-going picture interval peaking transient is coupled to the negative terminal of clamp capacitor 51, particularly when the network comprising circuit 55 and amplifier 52 are constructed as an integrated circuit. In such case a sufficiently large negative transient can cause input node C to be driven to a negative voltage (i.e., below ground potential) if it is large enough to forward bias the semiconductor substrate-to-ground junction at node C. A diode $D_S$ represents the semiconductor substrate-to-ground junction and is forward biased into conduction when the negative transient exceeds positive reference voltage $V_R$ at the negative terminal of capacitor 51 by approximately 0.7 volts or more. In this example reference voltage $V_R$ (+6.0 volts) is chosen to prevent this from occurring based upon the normally expected magnitudes of negative-going transients during picture intervals. Otherwise, if the substrate junction was permitted to become forward biased, the voltage at input node C would be clamped to −0.7 volts and the voltage at the negative terminal of clamp capacitor 51 would be rapidly discharged to a distorted level which would impair the AKB clamping function, and which could be difficult to recover from during succeeding clamping intervals. In fact, the distorted reference level could persist for a relatively long time, depending upon nature of the video information signal, its peaking content and duration. As a consequence, the gray scale image content (i.e., light to dark image shading) would be visibly impaired.

The voltage at the negative terminal of capacitor 51 comprises a relatively constant DC level qf +6.0 volts, which varies by only a few millivolts when the kinescope black current level is incorrect. This voltage is too large to be directly applied to the signal input of amplifier 52 (at the base of a transistor 80). Accordingly, level shifting network 55 comprising emitter follower transistors 70, 71, 73 and a diode 72 shift the DC level of the voltage developed at the negative terminal of capacitor 51 downward by +2.8 volts so that a DC voltage of approximately +3.2 volts is developed at the signal input of amplifier 52. This voltage is more appropriate for providing amplifier 52 with good dynamic range. Keyed current source transistors 74, 75 and 76 are associated with network 55.

Amplifier 52 comprises differentially connected transistors 80, 82 with respectively associated load resistors 84, 86 coupled to an operating supply voltage (e.g., +11 volts), and current source transistors 88, 89. A fixed reference voltage $V_{REF}$ (+3.2 volts) is applied to the base of transistor 82, and signals to be sampled with respect to the clamping reference level are applied to the base of signal input transistor 80 via transistor 73. The base voltages of transistors 80 and 82 are equal (i.e., balanced) when the kinescope black current level is correct, at which time transistors 80, 82 conduct equal output currents and equal output voltages are developed across differential output resistors 84, 86. The differential output voltages are applied to both OTA 53 and OTA 57. The differential input and output voltages of amplifier 52 are unbalanced by a few millivolts when the voltage at the negative terminal of capacitor 51 varies by a few millivolts when kinescope biasing is incorrect. Additional information concerning the role of transconductance amplifiers 53, 57 in the disclosed system is found in my copending concurrently filed U.S. patent application Ser. No 437,827, filed 10/29/84, titled "Signal Sampling Network with Reduced Offset Error", incorporated herein by reference.

In this arrangement good dynamic operating range of amplifier 52 requires that prescribed voltages exist at the base inputs of transistors 80 and 82 (in this case +3.2 volts) when kinescope biasing is correct. Level shifting network 55 assures that the voltage developed at the negative terminal of capacitor 51 is compatible with the signal input requirements of amplifier 52 associated with good dynamic range for amplifier 52.

In this embodiment the DC level shifting performed by network 55 is accomplished by means of offset voltages developed across semiconductor junctions only. The DC level shift is attributable to the substantially fixed (+0.7 volt) offset voltages developed across the base-emitter (diode) junctions of transistors 70, 71 and 73 and the offset voltage across diode 72, to provide a +2.8 volt offset voltage between the base of transistor 70 and the base of amplifier transistor 80. Resistors are not employed in the offset voltage path of circuit 55 for developing an offset voltage since their presence in the level shifting path comprising transistor 70 to transistor 73 would compromise the desired noise immune operation of level shifter 55, as will be discussed. Network 55 provides AC voltage gain of approximately unity because of its follower configuration, and current gain sufficient to supply the base current drive of amplifier transistor 80. In this connection it is noted that the base current of transistor 70 is extremely low (on the order of 250 nanoamperes) to prevent significant discharge of the voltage at the negative terminal of capacitor 51 during the clamping and sampling intervals when network 55 is conductive. For this purpose transistors 70 and 71 are arranged in a high input impedance Darlington amplifier configuration.

Amplifier 52 is rendered conductive during the AKB clamping and sampling intervals when current source transistors 88, 89 conduct in response to a keying signal $V_{K2}$. Amplifier 52 is rendered non-conductive during all other times when current source transistors 88, 89 are cut-off in response to keying signal $V_{K2}$. Similarly, level shifting network 55 is rendered conductive during the AKB clamping and sampling intervals, and non-conductive at all other times, in response to a keying signal $V_{K1}$ applied to a current source transistor 74 and in response to keying signal $V_{K2}$ applied to current source transistors 75, 76. Keying signals $V_{K1}$ and $V_{K2}$ are of the same polarity and time coincident, but differ in amplitude due to the different biasing requirements of transistors 75, 76, 88 and 89 relative to transistor 74.

Level shifting circuit 55 exhibits good immunity to switching transients produced when circuit 55 is rendered conductive and non-conductive in response to keying signals $V_{K1}$ and $V_{K2}$, as well as good immunity to noise and horizontal deflection scanning rate interference which may be present when circuit 55 is conductive. Such spurious transients, noise and interference can be coupled via transistors 74, 75 and 76 when conductive and can be troublesome due to the small signal variations (a few millivolts) being processed by circuit 55 and amplifier 52. However, such spurious signals are advantageously processed without significant amplification by circuit 55 because the collector outputs of current source transistors 74, 75, 76 drive low impedances corresponding to the low emitter impedances of transistors 70, 73 and low impedance diode 72. Any such spurious signals which are coupled to amplifier 52 via current source transistors 88, 89 appear as common-mode components in the differential output circuit of amplifier 52, and are nullified by the common-mode rejection characteristic of differential input transconductance amplifiers 53 and 57.

As noted previously, level shifting circuit 55 is rendered conductive during AKB intervals, non-conductive at other times. The latter condition produces several advantages, as follows.

When network 55 is non-conductive, the negative terminal of capacitor 51 is conductively decoupled such that the negative terminal of capacitor 51 is essentially deprived of a discharge path (at this time switch 56 is non-conductive since switch 56 is rendered conductive only during the clamping intervals in response to signal $V_C$) This is important since if circuit 55 remained conductive from one AKB interval to the next, the negative terminal of capacitor 51 could discharge by an amount in excess of thirty millivolts. Such amount of discharge is significant in this system and could compromise the effectiveness of the clamping function which establishes the reference voltage on the negative terminal of capacitor 51, because the clamping interval is very short (three horizontal line intervals), the value of clamp capacitor 51 is somewhat large (0.12 microfarads), and because the reference voltage established for capacitor 51 must be accurate within a fraction of a millivolt since voltage changes at input node C vary by only a few millivolts during AKB intervals when kinescope bias is incorrect, and these small variations must be reliably conveyed to amplifier 52. When circuit 55 is rendered non-conductive, the only discharge current for capacitor 51 comprises the negligibly small collector-to-base leakage current of transistor 70. This leakage current is several orders of magnitude less than the small base current present when transistor 70 is conducting. Switch 56 can be of the type described in my copending, concurrently filed U.S. patent application Ser. No. 437,828, filed 10/29/82, titled "Switching Network with Suppressed Switching Transients".

Amplifier 52 is also rendered non-conductive during non-AKB intervals. This eliminates a path for spurious signals which could otherwise distort the bias control voltage developed across output storage capacitor 58, and also assures that the level shifting path comprising transistors 70–73 remains non-conductive. Similarly, switch 56, OTA 53 and OTA 57 are non-conductive during non-AKB intervals. The fact that circuit elements 55, 52, 53, 56, 57 are non-conductive during non-AKB intervals advantageously conserves power consumption and reduces heating effects, since the AKB system is required to operate only during a few horizontal lines of each image scanning field comprising 256 horizontal scanning lines. The reduction in circuit heating significantly reduces the likelihood of thermal drift of the operating parameters of the circuit elements, which is important to assure predictable signal processing in a small signal processing system.

The discharging of output storage capacitor 58 during picture intervals when the AKB control system is not active is acceptably small because of the high input impedance of buffer 59 and its associated small input current (about 175 nanoamperes). In addition, output capacitor 58 is relatively large (10 microfarads) whereby any discharge via the input current of buffer 59 is negligible. The value of input clamp capacitor 51 should be small enough (e.g., on the order of 0.12 microfarads) to enable voltage variations indicative of the kinescope black current level to be coupled to circuits 55 and 52 without significant attenuation.

Figure 3:
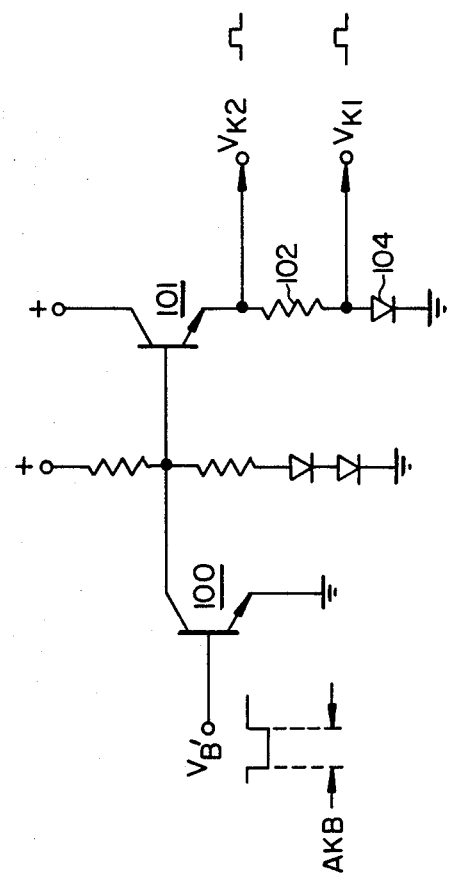
FIG. 3 shows details of a circuit associated with the operation of the level shifting circuit in FIG. 1.

FIG. 3 shows a circuit suitable for generating keying signals $V_{K1}$ and $V_{K2}$ for the system of FIG. 1. An input timing signal $V_B'$, an inverted version of signal $V_B$, is applied to a transistor 100 for controlling the conduction of a transistor 101. Keying signals $V_{K1}$ and $V_{K2}$ are derived from the emitter circuit of transistor 101, including a resistor 102 and a diode 104, as shown. Positive-going keying signals $V_{K1}$ and $V_{K2}$ are developed during AKB intervals in response to negative going timing signal $V_B'$.

Following is a more detailed discussion of the clamping and sampling operation of network 50, made with reference to the waveforms of FIG. 2.

Auxiliary signal $V_P$ is applied to circuit node B in FIG. 1 via a diode 35 and a voltage translating impedance network comprising resistors 32 and 34. Signal $V_P$ exhibits a given positive DC level at all times except during the AKB sampling interval, for maintaining diode 35 conductive so that a normal DC bias voltage is developed at node B. When the positive DC component of signal $V_P$ is present, the junction of resistors 32 and 34 is clamped to a voltage equal to the positive DC component of signal $V_P$, minus the voltage drop across diode 35. Signal $V_P$ manifests a negative-going, less positive fixed amplitude pulse component during the AKB sampling interval. Diode 35 is rendered non-conductive in response to negative pulse $V_P$, whereby the junction of resistors 32 and 34 is unclamped. Resistor 31 causes insignificant attenuation of the voltage change developed at node A relative to the corresponding voltage change ($V_1$) developed at node B since the value of resistor 31 is small relative to the values of resistors 32 and 34.

Prior to the clamping interval but during the AKB interval, the pre-existing nominal DC voltage ($V_{DC}$) appearing at node B charges the positive terminal of capacitor 51. During the clamping interval when grid drive pulse $V_G$ is developed, the voltage at node A decreases in response to pulse $V_G$ by an amount representative of the black current level. This causes the voltage at node B to decrease to a level substantially equal to $V_{DC}-V_1$. Also during the clamping interval, timing signal $V_C$ renders clamping switch 56 and OTA 53 conductive, whereby via feedback action reference voltage $V_R$ is developed at the negative terminal of clamp capacitor 51 as discussed. During the clamping interval, voltage $V_3$ across capacitor 51 is a function of reference set-up voltage $V_R$ at the negative terminal of capacitor 51, and a voltage at the positive terminal of capacitor 51 corresponding to the difference between the described pre-existing nominal DC level ($V_{DC}$) at node B and voltage change $V_1$ developed at node B during the clamping interval. Thus voltage $V_3$ across capacitor 51 during the clamping reference interval is a function of the level of black current representative voltage change $V_1$, which may vary. Voltage $V_3$ can be expressed as $(V_{DC}-V_1)-V_R$.

During the immediately following sampling interval, positive grid drive pulse $V_G$ is absent, causing the voltage at node B to increase positively to the pre-existing nominal DC level $V_{DC}$ that appeared prior to the clamping interval. Simultaneously, negative pulse $V_P$ appears, reverse biasing diode 35 and perturbing (i.e., momentarily changing) the normal voltage translating and coupling action of resistors 32, 34 such that the voltage at node B is reduced by an amount $V_2$ as indicated in FIG. 2. At the same time, clamping switch 56 and OTA 53 are rendered non-conductive and OTA 57 conducts in response to signal $V_S$.

Thus during the sampling interval the input voltage applied to the signal input at the base of transistor 80 of amplifier 52 is equal to the difference between the voltage at node B and voltage $V_3$ across input capacitor 51. The input voltage applied to amplifier 52 is a function of the magnitude of voltage change $V_1$, which can vary with changes in the kinescope black current level.

The voltage on output storage capacitor 58 remains unchanged during the sampling interval when the magnitude of voltage change $V_1$ developed during the clamping interval equals the magnitude of voltage change $V_2$ developed during the sampling interval, indicating a correct kinescope black current level. This results because during the sampling interval, voltage change $V_1$ at node B increases in a positive direction (from the clamping set-up reference level) when the grid drive pulse is removed, and voltage change $V_2$ causes a simultaneous negative-going voltage perturbation at node B. When kinescope bias is correct, positive-going voltage change $V_1$ and negative-going voltage change $V_2$ exhibit equal magnitudes whereby these voltage changes mutually cancel during the sampling interval, leaving the voltage at node B unchanged.

When the magnitude of voltage change $V_1$ is less than the magnitude of voltage change $V_2$, amplifier 52 proportionally charges storage capacitor 58 via OTA 57 in a direction for increasing cathode black current conduction. Conversely, amplifier 52 proportionally discharges storage capacitor 58 via OTA 57 for causing decreased cathode black current conduction when the magnitude of voltage change $V_1$ is greater than the magnitude of voltage change $V_2$.

As more specifically shown by the waveforms of FIG. 2, the amplitude "A" of voltage change $V_1$ is assumed to be approximately three millivolts when the cathode black current level is correct, and varies over a range of a few millivolts ($\pm \Delta$) as the cathode black current level increases and decreases relative to the correct level as the operating characteristics of the kinescope change. Thus the clamping interval set-up reference voltage across capacitor 51 varies with changes in the magnitude of voltage $V_1$ as the cathode black current level changes. Voltage change $V_2$ at node B exhibits an amplitude "A" of approximately three millivolts, which corresponds to amplitude "A" associated with voltage change $V_1$, when the black current level is correct.

As indicated by waveform $V_{COR}$ in FIG. 2, corresponding to a condition of correct kinescope bias, the voltage at the signal input of amplifier 52 remains unchanged during the sampling interval when voltages $V_1$ and $V_2$ are both of amplitude "A". However, as indicated by waveform $V_H$, the signal input voltage of amplifier 52 increases by an amount $\Delta$ when voltage change $V_1$ exhibits amplitude "A+$\Delta$", corresponding to a high black current level. In this event amplifier 52 discharges output storage capacitor 58 via OTA 57, so that the bias control voltage applied to the base of transistor 20 causes the collector voltage of transistor 22 to increase, whereby the cathode black current decreases toward the correct level.

Conversely, and as indicated by waveform $V_L$, the signal input voltage of amplifier 52 decreases by an amount $\Delta$ during the sampling interval when voltage change $V_1$ exhibits amplitude "A$-\Delta$", corresponding to a low black current level. In this case amplifier 52 charges output storage capacitor 58 via OTA 57, causing the collector voltage of transistor 22 to decrease whereby the cathode black current increases toward the correct level. In either case, several sampling intervals may be required to achieve the correct black current level.

The described combined-pulse sampling technique employing voltage changes $V_1$ and $V_2$ is discussed in greater detail in a copending U.S. patent application Ser. No. 434,314 of R. P. Parker titled "Signal Processing Network For An Automatic Kinescope Bias Control System", filed 10/14/82, incorporated herein by reference. This copending application also discloses additional information concerning the arrangement including auxiliary control signal $V_P$, as well as disclosing a suitable arrangement for timing signal generator 40.

What is claimed is:
1. In a system for automatically controlling the level of black image current conducted by an image display device in a video signal channel of a video information display system, said control system being operative during control intervals within image blanking intervals and including signal processing apparatus comprising:
   means for developing an output signal representative of the magnitude of said black image current;
   amplifier means with a signal input, and an output for providing a bias control signal to said image display device for maintaining a desired black current level;

clamping means including a charge storage device for receiving said representative signal;

means operative during a reference interval within said control interval for establishing a reference voltage on said storage device;

level shifting means for coupling said reference voltage to said signal input of said amplifier means for biasing said signal input compatible with the input bias requirements of said amplifier means; and means for rendering said level shifting means conductive during said control intervals, and for substantially inhibiting input currents of said level shifting means during intervals other than said control intervals to prevent the charge on said storage device and said reference voltage from being modified during said other intervals.

2. Apparatus according to claim 1, wherein said representative signal developing means is coupled to said video channel and said output of said signal developing means is subject to manifesting signal variations in accordance with video signal amplitude variations during video signal image intervals; and said reference voltage is selected to be related to normally expected maximum amplitude transitions manifested by said video signal during image intervals.

3. Apparatus according to claim 1, wherein said level shifting means is rendered non-conductive during said other intervals.

4. Apparatus according to claim 2, wherein the absolute magnitude of said reference voltage is selected to be greater than the absolute magnitude of normally expected maximum video signal amplitude transitions in a white-going image direction.

5. Apparatus according to claim 2, wherein said charge storage means comprises an AC coupling capacitor for coupling said representative signal to said amplifier means via said level shifting means, said capacitor having a first terminal coupled to said output of said signal developing means, and having a second terminal coupled to said level shifting means; and said reference voltage is established at said second terminal of said capacitor.

6. Apparatus according to claim 1, wherein said amplifier means comprises a differential input amplifier with differential outputs; and said amplifier means is rendered non-conductive concurrently with said level shifting means during said other intervals.

7. Apparatus according to claim 1, wherein said level shifting means consists of the means by which said storage device is coupled to said signal input of said amplifier means; and said level shifting means provides a signal coupling path from said storage means to said amplifier means consisting of semiconductor junction means 8. Apparatus according to claim 7, wherein said semiconductor junction means corresponds to the base-emitter junction of a transistor; and said level shifting means includes switching means coupled to the low impedance emitter of said transistor and responsive to timing signals for controlling the conductive state of said transistor and thereby the conductive state of said level shifting means.

9. Apparatus according to claim 2, wherein said level shifting means consists of the means by which said storage device is coupled to said signal input of said amplifier means; and said level shifting means provides a signal coupling path from said storage means to said amplifier means consisting of semiconductor junction means 10. Apparatus according to claim 9, wherein said semiconductor junction means corresponds to the base-emitter junction of a transistor; and said level shifting means includes switching means coupled to the low impedance emitter of said transistor and responsive to timing signals for controlling the conductive state of said transistor and thereby the conductive state of said level shifting means.

11. Apparatus according to claim 1, wherein said amplifier means, said charge storage device and said level shifting means comprise a feedback clamping network during said reference interval for establishing a reference bias condition for said amplifier means.

12. Apparatus according to claim 11, wherein said representative signal developing means is coupled to said video channel and said output of said developing means is subject to manifesting signal variations in accordance with video signal amplitude variations during video signal image intervals; and said reference voltage is selected to be related to normally expected maximum amplitude transitions manifested by said video signal during image intervals.

13. In a system for automatically controlling the level of black image current conducted by an image display device in a video signal channel of a video information display system, said control system being operative during control intervals within image blanking intervals and including signal processing apparatus comprising:

means for developing an output signal representative of the magnitude of said black image current;

amplifier means with a signal input, and an output for providing a bias control signal to said image display device for maintaining a desired black current level;

a charge storage device for receiving said representative signal;

level shifting means for coupling said storage device to said signal input of said amplifier means for providing signals thereto compatible with the input bias requirements of said amplifier means; and means operative during a reference interval within said control interval for interconnecting said amplifier means, said storage device, and said level shifting means as a feedback clamping network for establishing a reference voltage on said storage device for determining a reference bias condition for said amplifier means.

* * * * *